(12) United States Patent
Koukkari et al.

(10) Patent No.: US 8,063,513 B2
(45) Date of Patent: Nov. 22, 2011

(54) POWER SOURCE AND METHOD FOR CONTROLLING OPERATIONAL POWER

(75) Inventors: Eero Koukkari, Oulu (FI); Pasi Kurttio, Oulu (FI)

(73) Assignee: Esju Oy, Oulu (FI)

( * ) Notice: Subject to any disclaimer, the term of this patent is extended or adjusted under 35 U.S.C. 154(b) by 919 days.

(21) Appl. No.: 11/631,073

(22) PCT Filed: Jun. 28, 2005

(86) PCT No.: PCT/FI2005/050243
§ 371 (c)(1),
(2), (4) Date: Feb. 28, 2007

(87) PCT Pub. No.: WO2006/000646
PCT Pub. Date: Jan. 5, 2006

(65) Prior Publication Data
US 2009/0189449 A1    Jul. 30, 2009

(30) Foreign Application Priority Data

Jun. 29, 2004   (FI) .................................. 20045251

(51) Int. Cl.
*H02J 3/00*    (2006.01)
*H03F 1/00*    (2006.01)
(52) U.S. Cl. ......................................... 307/72; 330/199
(58) Field of Classification Search .............. 307/72; 330/199
See application file for complete search history.

(56) References Cited

U.S. PATENT DOCUMENTS

| 4,825,141 | A | 4/1989 | Watanabe |
| 6,121,761 | A | 9/2000 | Herbert |
| 6,137,359 | A | 10/2000 | Gorcea et al. |
| 7,026,797 | B2 * | 4/2006 | McCune, Jr. .................. 323/225 |
| 7,091,772 | B2 * | 8/2006 | Friedel et al. .................... 330/10 |
| 7,739,522 | B2 * | 6/2010 | Festo et al. ..................... 713/300 |
| 2002/0031032 | A1 | 3/2002 | Ooishi |

FOREIGN PATENT DOCUMENTS

| EP | 0447637 | | 9/1991 |
| WO | WO2005041404 | * | 5/2005 |

OTHER PUBLICATIONS

Toumazou et al.: "Current-feedback versus voltage feedback amplifiers: history, insight and relationships" proceedings of the International Symposium on Circuits and Systems (ISCS), Chicago, May 3-6, 1993, New York, IEEE, US, vol. 2, pp. 1046-1049.

* cited by examiner

*Primary Examiner* — Michael Rutland Wallis
(74) *Attorney, Agent, or Firm* — Young & Thompson

(57) ABSTRACT

The solution controls electric operational power to be fed to an amplifier. The control can be carried out, for instance, in accordance with a predetermined signal. The operational power is fed to the amplifier with a voltage source unit and a current source unit, and the operational voltage that the voltage source unit feeds to the amplifier is controlled. The current source unit feeds at least some of the operational electric current of the amplifier.

16 Claims, 5 Drawing Sheets

POWER SOURCE AND METHOD FOR CONTROLLING OPERATIONAL POWER

FIELD

The invention relates to a power source and a method for controlling operational power to be fed to an amplifier.

BACKGROUND

Large variations in signal amplitude make it difficult to design an amplifier that operates with good efficiency. In conventional amplifiers the efficiency reduces as the signal level reduces, which is due to increasing voltage losses in the active part of the amplifier. Telecommunications systems, such as WCDMA (Wideband Code Division Multiple Access) or UMTS (Universal Mobile Telecommunications System) radio systems, require power amplifiers operating with good efficiency to amplify transmitted radio-frequency signals.

Good efficiency is a worthwhile object, because poor efficiency means high power consumption and results in warming up of the amplifier, which in turn makes the amplifier less reliable. In addition, in order to prevent the amplifier from warming up a cooling fan may be needed, which further increases the energy consumption, may cause undesirable noise and makes the mechanical structure more complicated. High energy consumption, in turn, incurs economic costs.

It is known to improve the efficiency of an amplifier by using an electric power source whose operational voltage generated for the amplifier can be controlled in accordance with the strength of the signal to be amplified. In that case the power source is generally a chopper power source.

It is also known to improve the efficiency of an amplifier by using two separate operational voltage sources. In that case, when the strength of the signal to be amplified remains under a predetermined value, the operational voltage of the amplifier is obtained from the first operational voltage source, but when the value of the signal strength exceeds a predetermined value, the operational voltage source of the amplifier is exchanged for a second voltage source, by means of which the amplifier is better able to amplify a strong signal part. As the strength of the signal to be amplified gets back below a predetermined value, the first voltage source is switched back to the amplifier.

These solutions involve several problems, however. It is difficult to implement good efficiency in a power source whose operational voltage generated for the amplifier is controlled at high modulation rate, i.e. at high change rate of the operational voltage. If the power source is not capable of following the modulation with a sufficient accuracy, distortion and interference are caused to the signal or signals, which poses a problem in the amplifiers of WCDMA or UMTS radio systems in particular.

Switching between a plurality of operational voltage sources involves slowness, which makes efficiency poorer and distorts signals to be amplified.

BRIEF DESCRIPTION

The object of the invention is to provide an improved method and a power source implementing the method.

This is achieved by a power source for an amplifier the power source being arranged to control electric operational power to be fed to the amplifier. The power source comprises at least one voltage source unit and at least one current source unit, of which units each voltage source unit is configured to control the operational voltage fed to the amplifier and each current source unit is configured to feed operational electric current to the amplifier.

The invention also relates to a power source for an amplifier the power source being arranged to control electric operational power to be fed to the amplifier. The power source comprises at least one voltage source unit which is configured to control the operational voltage fed to the amplifier and the power source comprises at least one electric recycle circuit that is configured to receive as operational electric current at least some of the electric operational power exceeding the operational power need of the amplifier.

The invention further relates to a method for controlling the electric operational power fed to the amplifier. The method comprises feeding operational power to the amplifier with at least one voltage source unit and at least one current source unit and controlling the operational voltage each voltage source unit feeds to the amplifier and feeding with each current source unit at least some of the operational electric current of the amplifier.

The invention further still relates to a method for controlling the electric operational power to be fed to the amplifier. The method comprises controlling the operational voltage at least one voltage source unit feeds to the amplifier and receiving by means of an electric recycle circuit at least some of the electric operational power exceeding the operational power need of the amplifier to serve as operational electric current.

The preferred embodiments of the invention are disclosed in the dependent claims.

Several advantages are achieved with the method and the power source of the invention. The value of operational voltage may change quickly and couplings between various power sources are avoided.

LIST OF DRAWINGS

In the following the invention will be described in greater detail in connection with preferred embodiments with reference to the attached drawings, in which FIG. 1 is a block diagram of an analogue power source solution;

DESCRIPTION OF EMBODIMENTS

Figure 1:
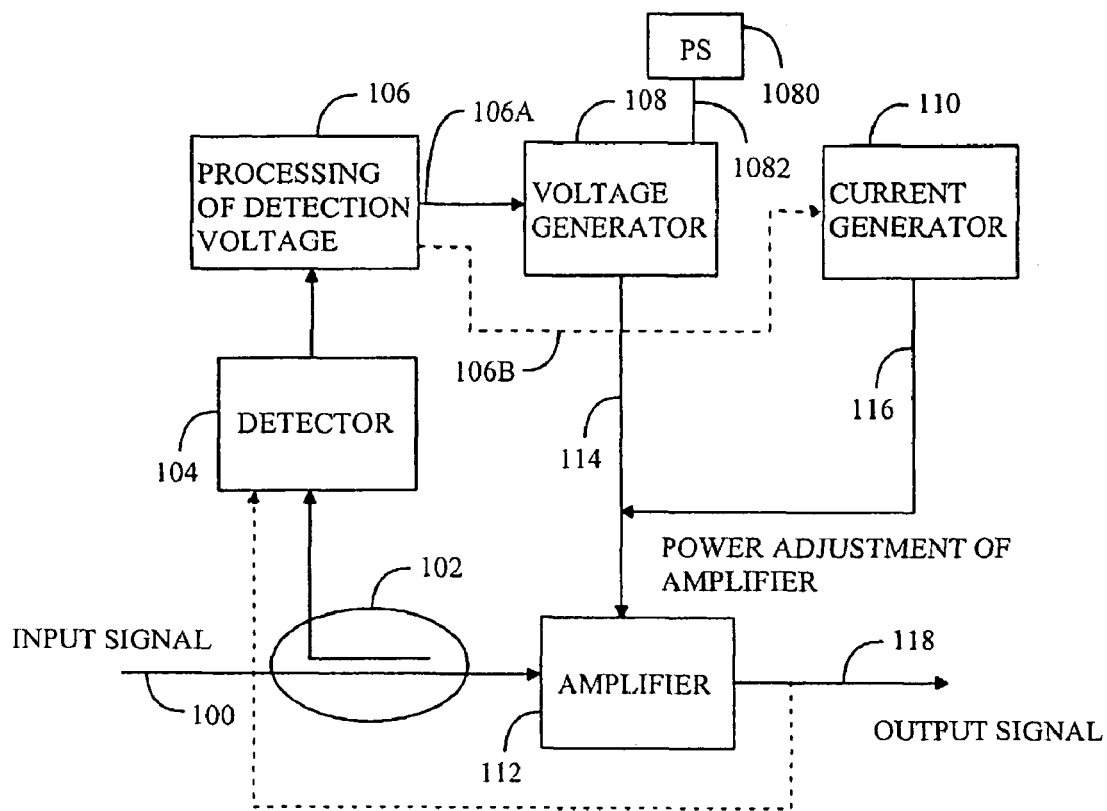

A power source is now discussed by means of an example based on analogue technology as shown in FIG. 1. A signal 100 to be amplified is sampled with a sampling device 102, such as a directional switch, which feeds the sample to a detector 104. Sampling with the directional switch 102 refers to switching a small portion (e.g. 1%) of the amplified signal to the detector 104 and the remaining portion (99% in this example) is applied to an amplifier 112. The detector 104 may detect the strength of the sample, which may correspond to any of the following values of the amplified signal 100 (or a predetermined signal, which is described in greater detail later on in the text): the effective value, peak value or mean value of the envelope, the absolute value of voltage amplitude, a combination of the above values, or the like. The detected signal may propagate to a signal processing circuit 106, where the detected signal can be amplified and the detected signal can be shifted to the desired DC level, i.e. so-called DC level shifting can be performed.

In addition, the variation range of the signal modified in this manner can be limited by setting a lower limit below which the effective power or amplitude value of the signal modified in the signal processing circuit 106 is not allowed to go. This can be implemented, for instance, by diode resistance modifiers, which modify the signal linearly section by section. In addition to the limitation, the signal can be modified in a desired manner. Average strength of the amplified signal 100 can be formed with a signal processing circuit 106 within a predetermined sliding time window for the current source unit 110 of the power source. In signal processing the bandwidth must be many times larger than in amplitude modulation of the signal to make sure the timing and accuracy of the control. Otherwise the signal processing can be implemented with separate components and/or integrated components using the fast basic analogue technology.

The signal processing circuit 106 may control at least one voltage source unit 108 included in the power source of the amplifier 112, and optionally also at least one current source unit 110. The voltage source unit 108 may be an amplifier with direct voltage coupled as operating electricity. In such a case the voltage source unit 108 may be implemented as a (unit) amplifier. The efficiency of the voltage source unit 108 included in the power source can be improved by modulating the operational voltage 1082 of the power source 1080 of the voltage source unit. In that case at least the value of operational voltage 114 that the voltage source unit 108 feeds to the amplifier 112 varies according to the output signal of the signal processing circuit 106, which signal in turn may vary in a predetermined manner in relation to the amplified signal 100 or any other predetermined signal. The voltage source unit 108 may be an amplifier having sufficient bandwidth and current output capability and having low output impedance.

The output impedance of the current source unit 110 may be high on a wide frequency band. The current source unit 110 can be implemented by means of a chopper power source, but it can also be implemented by linear technology or a combination thereof. In the case of high modulation frequencies it is possible to provide series inductance on the output side of the current source unit, which inductance forms large impedance at high frequencies.

With the power source provided for the amplifier 112 of FIG. 1 it is thus possible to control electric operational power that is fed to the amplifier 112 in accordance with the strength of the signal 100 amplified with the amplifier 112 or in accordance with the output signal 118 of the amplifier (broken line in FIG. 1). Controlling can also be performed in accordance with a predetermined signal, which may be an output signal 118 of the amplifier 112 or signal information possessed by the signal processing circuit 106, generated by the signal processing circuit 106 or introduced to the signal processing circuit 106 on the desired amplifier output signal at each instant of time. In addition, controlling can be performed with an amplified signal 100 modified in a desired manner and/or with a predetermined signal modified in a desired manner.

The amplifier 112 can be any amplifier that allows operational voltage control. The amplifier can be an amplifier implemented with a bipolar transistor, FET (Field Effect Transistor), GaAsFET (Gallium Arsene Field Effect Transistor) or the like. The amplifier 112 may also operate in different operational classes, such as A, B, AB, C, D, E, S or the like.

The voltage source unit 108 may control the operational voltage 114 fed to the amplifier 112 in accordance with the strength of the signal 100 to be amplified with the amplifier 112 and/or in accordance with a predetermined signal. The current source unit 110, in turn, is intended to feed operational electric current 116 to the amplifier 112. Some of the operational electric current of the amplifier 112 may originate from the voltage source unit 108. The operational electric current 116 the current source unit 110 feeds to the amplifier 112 may be unvarying constant current or the operational electric current 116 may vary according to the strength of the signal 100 to be amplified or according to a predetermined signal or a signal modified therefrom.

Figure 2:
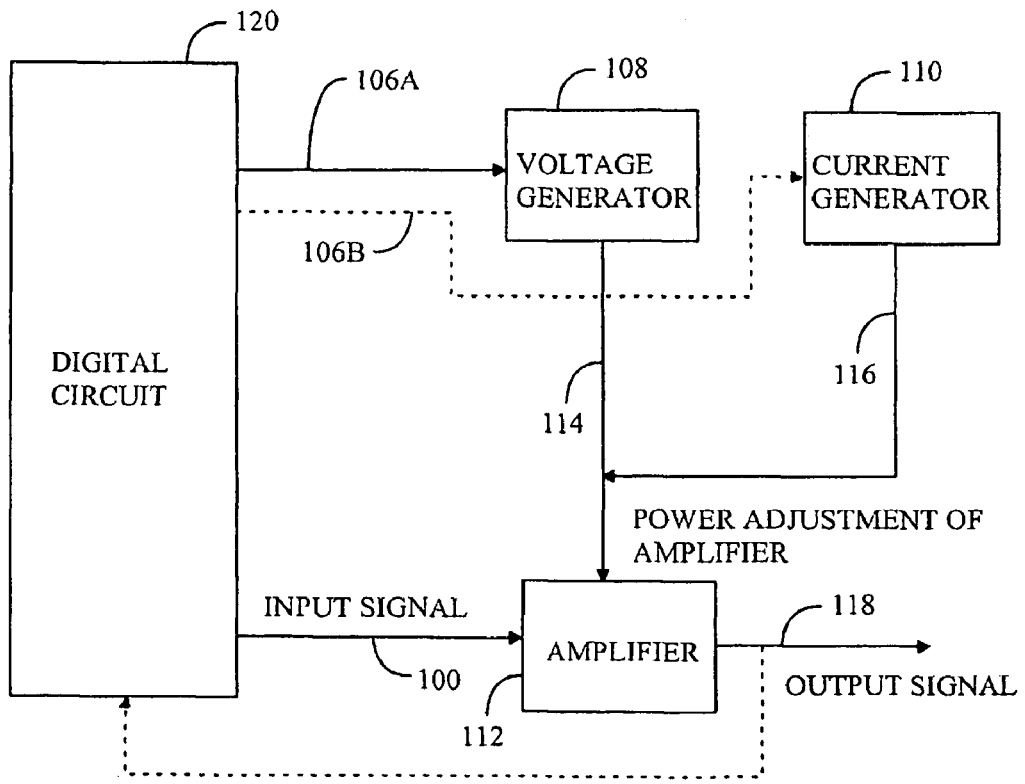
FIG. 2 is a block diagram of a digital power source solution.

FIG. 2 shows an example based on digital technology. A digital circuit 120 may generate control signals 106A and 106B of the voltage source unit 108 and the current source unit 110 serving as a signal processing circuit or at least convey control signals 106A and 106B generated elsewhere to the voltage source unit 108 and the current source unit 110. The digital circuit 120 may contain information on a predetermined signal, in accordance to which the control signals 106A and 106B may control the voltage source unit 108 and the current source unit 110. The predetermined signal may be an output signal that the amplifier 112 is desired to generate or the actual amplifier output signal 118 (along the broken line in FIG. 2) connected to the digital circuit 120 or a signal modified therefrom may serve as the predetermined signal. Instead of an unamplified predetermined signal it is also possible to feed into the amplifier a signal modified therefrom, for instance, a predistorted or a non-amplitude-modulated signal. When a non-amplitude-modulated signal is fed to the amplifier the amplitude modulation can be performed by means of the described connection. The amplified signal 100 can be generated as non-amplitude-modulated in the digital circuit 120 or the amplitude modulation can be undone with a separate circuit (not shown in FIG. 2) partly or completely prior to feeding the signal into the amplifier 112. The described solution can also be implemented such that part of it is based on digital technology and part of it is based on analogue technology.

With reference to both FIG. 1 and FIG. 2, the operational electric voltage 114 can be controlled by means of the signal 100 or the modified amplified signal. In such a case the control may be based on an instantaneous value of the amplified signal 100, a value integrated in a desired time window, a value obtained by derivation or a value obtained by a desired function. Between the operational electric voltage 114 and the amplified signal 100 there may also be statistical, mathematical or physical dependence or a combination thereof. In that case the operational electric voltage may comply with the average strength of the amplified signal 100. Instead of the dependence between the operational electric voltage 114 and the amplified signal 100, in the corresponding manner, the dependence used in the control may be that between the operational electric voltage 114 and the predetermined signal.

In the same way the operational electric current 116 can be controlled by means of the signal 100 to be amplified or the modified signal to be amplified. In that case the control may be based, for instance, on an instantaneous value of the amplified signal 100, a value integrated in a desired time window, a value obtained by derivation or a value obtained by a desired function. Between the operational electric current 116 and the amplified signal 100 there may also be statistical, mathematical or physical dependence or a combination thereof. In that case the operational electric current may comply with the average strength of the amplified signal 100. Instead of the dependence between the operational electric current 116 and the amplified signal 100, in the corresponding manner, the dependence used in the control may be that between the operational electric current 116 and the predetermined signal. An advantage with controllable operational current is high efficiency in particular at low average power ranges of the amplified signal. The current source unit and the voltage source unit can be controlled on the basis of different dependences or different signals. Instead of or in addition to functions denoting statistical and/or mathematical dependence the control may also be based on the use of matrices.

The voltage source unit may have low output impedance and the current source unit may have high output impedance. In addition the operational electric current generated by the current source unit may be independent of the modulation of the amplified signal. The resistive portion of the serial impedance of the voltage source unit is usually less than a tenth of the resistive portion of the serial impedance of the amplifier constituting a load on most of the frequency band of the signal 114.

The voltage source unit and the current source unit have no effect on one another and they can be controlled independently. In addition, the impedance of the voltage source unit is low, which means clearly lower impedance that that of the amplifier 112 constituting a load or the output impedance of current source unit. The impedance of the current source unit is generally more than ten times higher than the resistive portion of the serial impedance of the voltage source unit on most of the frequency band of the signal 114.

The output impedance of the current source unit is high and it does not cause loading in the voltage modulation event. High impedance refers to load that is as unimpeded as possible from the viewpoint of the voltage source unit and it enables, for its part, the highest possible modulation rate and accuracy of the voltage.

The current source unit supplies at least some of the operational electric current required by the amplifier. Thus the required operational electric current of the voltage source unit is respectively lower, which enables use of components that are fast in operation (fast components are more readily available for low powers).

Figure 3:
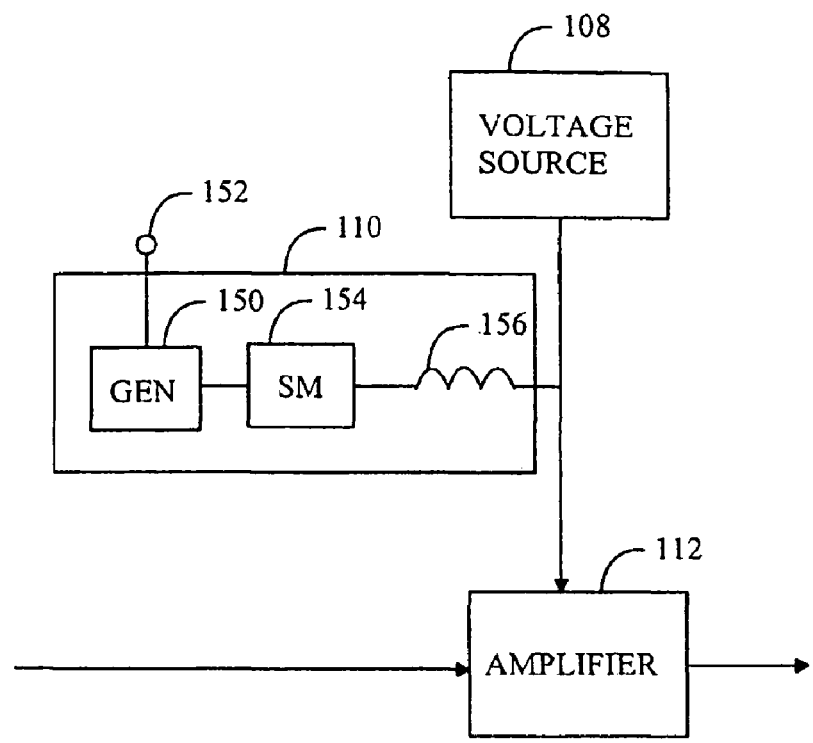
FIG. 3 shows internal switching of a current source unit.

The internal connection of the current source unit may be as shown in FIG. 3. The current source unit 110 may comprise a generator part 150 with operational power from a pole 152. The generator part 150 generates the electric power for the electric current to be fed to the amplifier. The generator part 150 can be considered as a current source or a voltage source, but from the viewpoint of the current source unit 110 the only thing that matters is that the current source unit 110 serves as a current source. The electric power generated by the generator part 150 may propagate to a chopper circuit 154 that separates the voltage source unit 108 and the amplifier 112 from the generator part 150 by means of high impedance. From the chopper circuit 154 the electric power may propagate to an inductive unit 156 comprising at least one coil. The inductive unit 156 provides high output impedance to the current source unit 110. The current source unit 110 may comprise just a chopper circuit 154 without an inductive unit 156 or just an inductive unit 156 without a chopper circuit 154. The high, broadband output impedance of the current source unit 110 can be provided with a chopper circuit 154 or an inductive unit 156 alone (or by using both of them). Instead of the chopper circuit 154 it is also possible to use a current regulator or the like.

Figure 4:
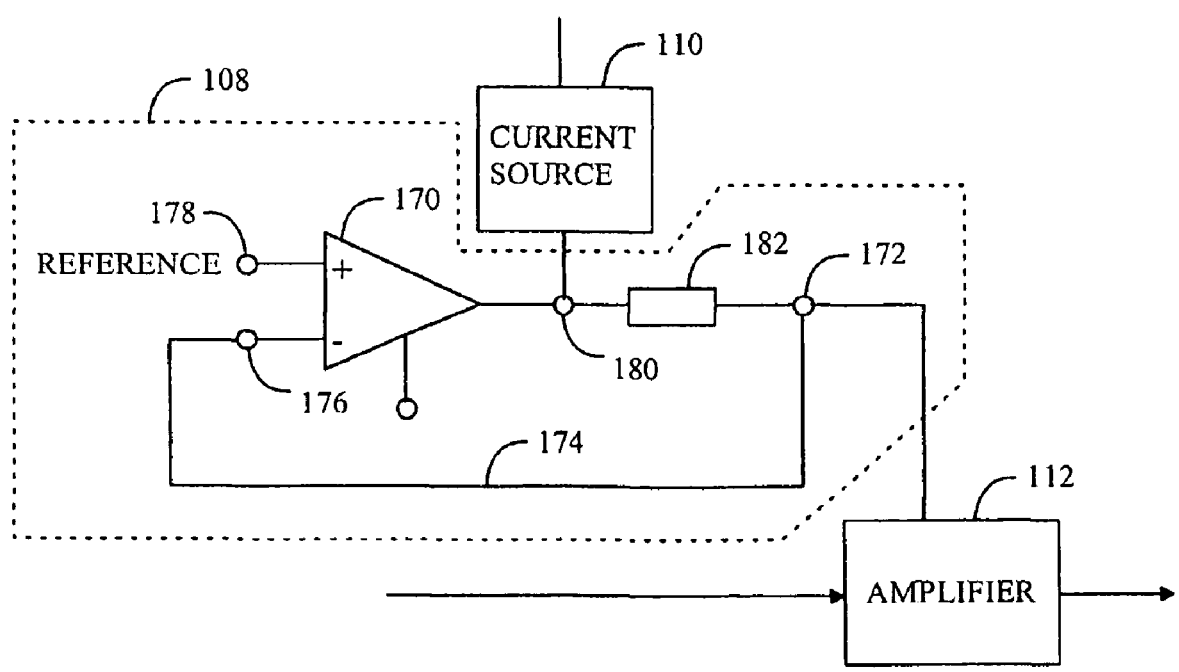
FIG. 4 shows a solution, in which a current source unit supplies current into the voltage source unit.

FIG. 4 shows an example of an alternative manner to interconnect the current source unit and the voltage source unit. In this solution the current source unit feeds current into the voltage source unit. In the connection, which is given as a non-restrictive example, the voltage source unit 108 may act in the manner of an operational amplifier and it comprises feedback 174 from an output pole 172 to a (negative) input pole 176 of the voltage source unit. A second input pole 178 is connected to reference voltage and by changing the reference voltage it is possible to change the output voltage of the voltage source unit. The current source unit 110 feeds electric current it generates to the output pole 180 of the amplifier part 170. Between the output pole 180 of the amplifier part and the output pole 172 of the voltage source unit there may be connected a low-resistance resistive unit 182 that comprises at least one resistor. The value of the resistive unit may range from a few ohms to fractions of an ohm (e.g. $0.001\Omega$). Generally the current source unit can be connected to such a point in the voltage source unit from which the electric current can be transferred with little loss to the amplifier 112.

Figure 5:
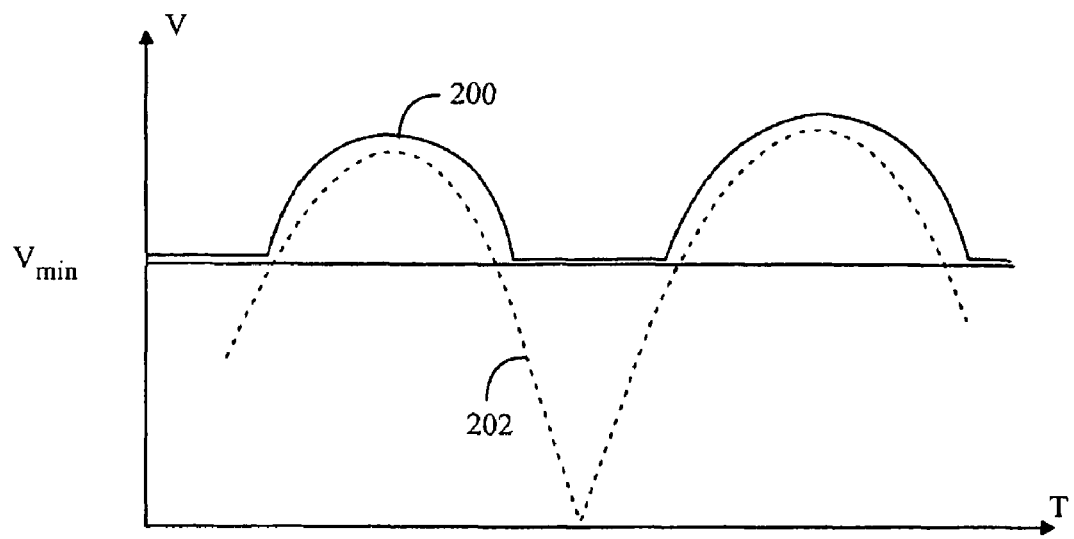
FIG. 5 shows how the operational voltage behaves in relation to the strength of an amplified signal.

FIG. 5 shows the operational voltage value 200 of the amplifier and the strength 202 of the amplified signal. In the Cartesian coordinates the x-axis denotes time T and the y-axis denotes signal strength on a freely selected scale. Even though the strength 202 of the amplified signal descends very low in places, the operational voltage value 200 may be limited by means of a signal processing circuit 106 or in the voltage source unit 108 such that it will not go below a predetermined lower limit $V_{min}$. Limitation of this kind may be necessary, because the amplifier properties of RF amplifiers in particular may deteriorate at low operational voltages. The operational voltage of the amplifier can be adjusted, however, to be as low as possible without deterioration of the amplifying properties of the amplifier. On the basis of the manufacturer's information the user may select a suitable amplifier and define a minimum voltage that allows the amplifier to work in an appropriate manner. This voltage level can be defined as the lower limit for the operational voltage.

In known solutions the operational voltage of the amplifier equals to the peak voltage of the voltage source. In the present solution some of the operational electric current of the amplifier is generated with the current source unit whose DC voltage is lower than the maximum value of the operational voltage generated by the voltage source.

In addition, the presented solution may employ an electric current recycle circuit that recovers the electric current the amplifier 112 serving as load is unable to use. The power source may thus comprise at least one electric recycle circuit which is configured to receive as operational electric current at least some of the electric operational power that exceeds the amplifier's operational power need.

Figure 6:
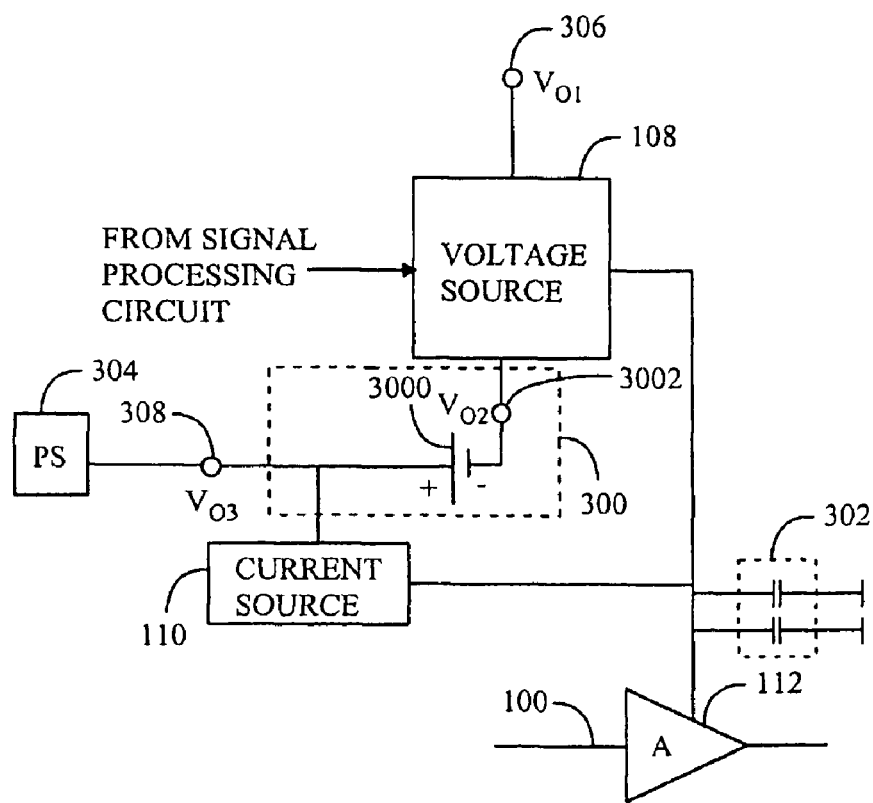
FIG. 6 shows a power source solution including a recycle circuit of electric current.

This solution is studied with the assistance of FIG. 6, in which the recycle circuit 300 is placed between the voltage source unit 108 and the current source unit 110. At first a capacitive unit 302 including at least one capacitor is omitted. The recycle circuit 300 includes a power source 3000 that can be a DC power source, such as a battery, or the DC power source can be a chopper power source or the like. It is now assumed, for instance, that the current source unit 110 generates constant current I=3 A, in the voltage source unit there are connected an upper voltage $V_{o1}$=28 V to pole 306 and a lower voltage $V_{o2}$=15 V to pole 3002, direct voltage $V_{o3}$=18 V is connected from the power source 304 to the current source unit, the voltage of the DC power source 3000 is 3 V and the minimum operational voltage of the amplifier 112 is about $V_{min}$=15 V. The maximum amount of electric current required by the amplifier 112 is 7 A in this example. In this example an average value of voltage supplied to the amplifier 112 by the voltage source unit is 18 V. The DC power source 3000 provides a voltage difference of 3 V between the poles 3002 and 308, whereby the pole 3002 will have 3 V lower voltage than the pole 308. When the amplifier 112 needs more operational power, the voltage value supplied to the amplifier by the voltage source unit 108 may rise up to 28 V. In addition the voltage source unit 108 may feed current to the amplifier as much as 4 A, whereby the total amount of electric current produced by the voltage source unit 108 and the current source unit 110 altogether corresponds to the amount of electric current of 7 A required by the amplifier 112. When the operational power need of the amplifier 112 reduces, the value of voltage fed to the amplifier 112 by the voltage source unit may go down to about 15 V and the amount of electric current fed to the amplifier by the voltage source 108 may cease altogether. When the amount of electric current generated by the current source unit 110 exceeds the amount of electric current required by the amplifier 112, a portion of the electric current flows to the voltage source unit 108 and via the pole 3002 and the DC power source 3000 further back to the current source unit 110. In this manner momentarily generated, extra electric current is not wasted but it will be reused. The portion of the electric current that is recycled to the current source unit 110 reduces the electric power supplied from the power source 304 to the current source 110. Even though the recycle circuit 300 may operate continuously and recycle the electric current any time there is more electric current available than the amplifier 112 needs, the recycle circuit 300 may receive operational electric current from the amplifier 112 particularly when the strength of the amplified signal decreases or the strength of the amplified signal is below a predetermined lower limit.

Figure 7:
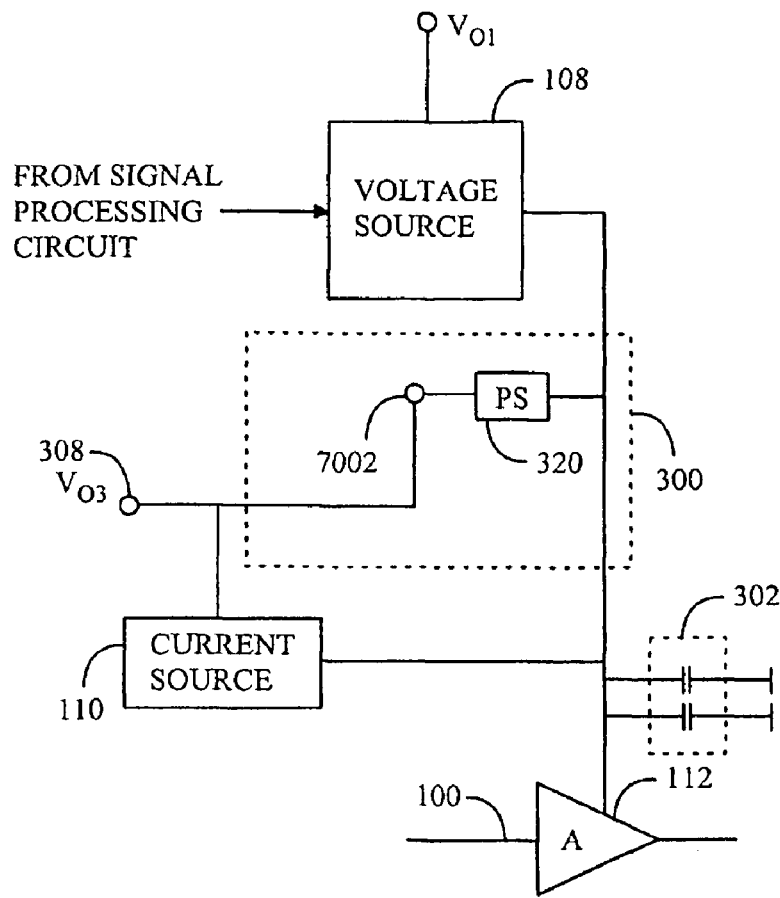
FIG. 7 shows another power source solution including a recycle circuit of electric current.

As shown in FIG. 7 the recycled electric current need not necessarily be recycled through the voltage source 108, but the recycling may also be carried out by means of the power source 320 or another electric circuit that is connected between the operational voltage 114 fed by the voltage source 108 and the pole 7002. The power source 320 may be a chopper power source controlled by a signal processing circuit.

Figure 8:
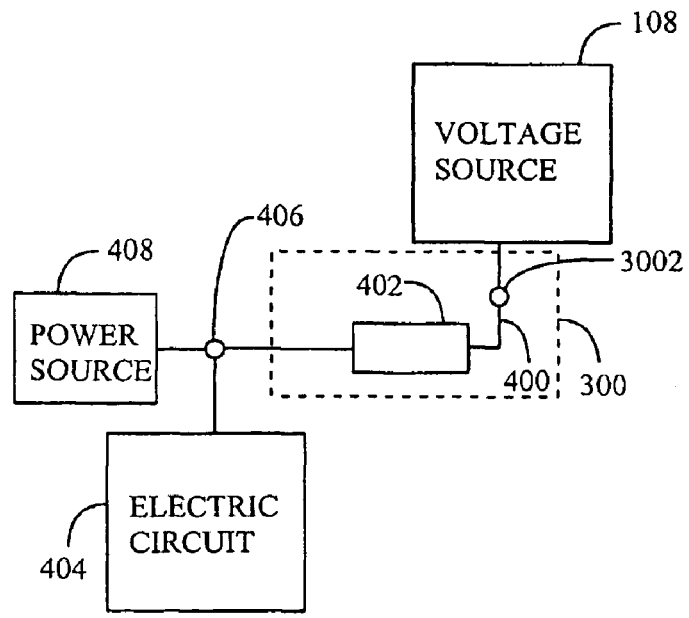
FIG. 8 shows how electric current is recycled to a second electric circuit.

The recycling circuit 300 may transfer the received operational electric current to the current source unit 110 for reuse as shown in FIGS. 6 and 7, or the received electric current may be transferred for use in another electric circuit. This solution is shown in FIG. 8. The recycle circuit 300 may comprise a conductor 400 by which the electric current to be recycled is transferred for use in another electric circuit 404. The conductor 400 may be connected to pole 406 by which operational power is fed from the power source 408 to the electric circuit 404. In that case the power from the power source 408 is reduced with the amount equalling the recycled electric current. Between the poles 3002 and 406 there may be an adapting element 402 that may adapt voltages, for instance, in the same manner as the DC power source 3000 in FIG. 6. The adapting element 402 may comprise a controlled power source or the like.

As shown in FIGS. 6 and 7 the recycle circuit 300 may recycle a charge discharging as electric current and stored in the capacitive unit 302 when the operational voltage required by the amplifier reduces. The capacitive unit 302 represents all the capacitive load that is associated with the amplifier 112 (RF adaptation, filtration, etc.). In that case electric current flows out from the capacitive unit 302 and as the amplifier is not able to use all the current, the electric current flows via the voltage source unit 108 to the pole 3002, from which the electric current can be recycled in the above-described manner back to the current source unit 110, the voltage source unit 108 or to another electric circuit 404 to serve as operational electric current. This expedites the adaptation of the amplifier amplification to the amplified signal 100.

Figure 9:
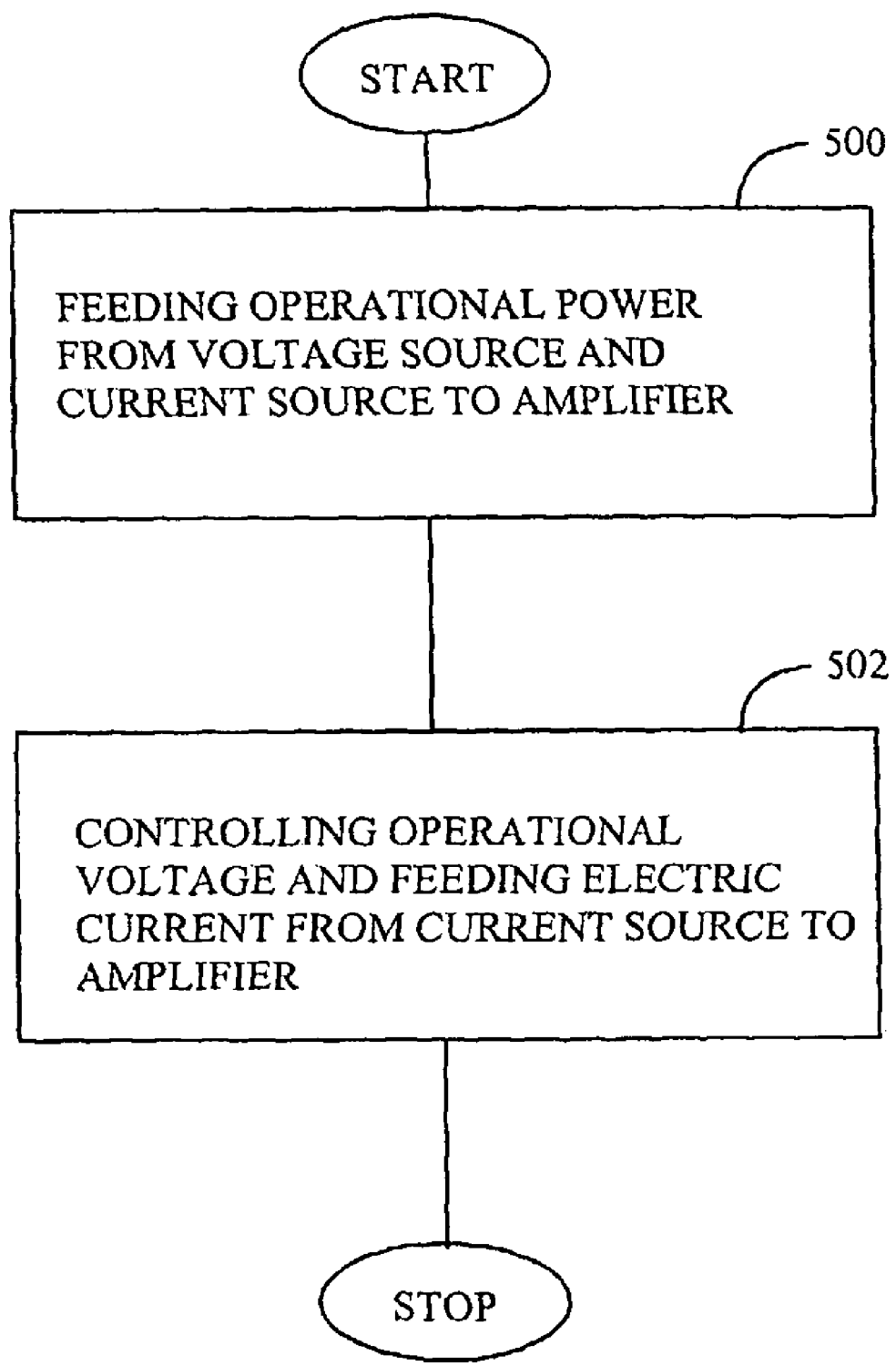
FIG. 9 is a flow chart of the method.

The presented solution is further studied by means of a flow chart of FIG. 9 representing the method. The method controls the electric operational power to be fed to the amplifier in accordance with a signal 100 to be amplified with the amplifier or a predetermined signal. In method step 500 the operational power is fed to the amplifier with a separate voltage source unit 108 and current source unit 110. In step 502 the operational voltage that the voltage source unit 108 feeds to the amplifier 112 is controlled in accordance with the signal 100 to be amplified with the amplifier 112 or the predetermined signal and at least some of the operational electric current of the amplifier is fed with the current source unit 110.

Even though the invention is described above with reference to the attached drawings, it is obvious that the invention is not restricted thereto but it may be modified in various ways within the scope of the accompanying claims.

The invention claimed is:

1. A power source for an amplifier, the power source being arranged to control electric operational power to be fed to the amplifier, the power source comprising:
at least one voltage source unit and at least one current source unit, of which said at least one voltage source unit is configured to control the operational voltage to be fed to the amplifier, and
wherein the at least one current source unit is configured to receive at least part of the power as current, which is from a lower voltage pole of the voltage source unit, and to feed operational electric current for the amplifier.

2. A power source as claimed in claim 1, wherein said at least one current source unit is configured to feed constant current.

3. A power source as claimed in claim 1, wherein said at least one current source unit is configured to receive a control signal controlling the current output.

4. A power source as claimed in claim 1, wherein said at least one current source unit is configured to feed current on the basis of at least one of the following:
a signal to be amplified with the amplifier,
an output signal of the amplifier,
an amplified signal modified in a desired manner,
a predetermined signal, and
a predetermined signal modified in a desired manner.

5. A power source as claimed in claim 1, wherein the power source is configured to modulate the operational voltage of the at least one voltage source unit.

6. A power source as claimed in claim 1, wherein each said voltage source unit is configured to control the operational voltage to be fed to at least one amplifier on the basis of at least one of the following:
a signal to be amplified with the amplifier,
an amplified signal modified in a desired manner,
a predetermined signal, and
a predetermined signal modified in a desired manner.

7. A power source for an amplifier, the power source being arranged to control electric operational power to be fed to the amplifier, the power source comprising:
at least one voltage source unit that is configured to control the operational voltage to be fed to the amplifier; and
at least one electric recycle circuit that is capable of receiving at least some of the electric operational power that exceeds the operational power need of the amplifier, including operational electric current from a capacitive load associated with the amplifier.

8. A power source as claimed in claim 7, further comprising a current source unit, and wherein said at least one electric recycle circuit is configured to transfer the received operational electric current to the current source unit.

9. A power source as claimed in claim 7, wherein said at least one electric recycle circuit is configured to transfer the received operational electric current for use in another electric circuit.

10. A power source as claimed in claim 7, wherein the power source is configured to modulate the operational voltage of the at least one voltage source unit.

11. A power source as claimed in claim 7, wherein each said voltage source unit is configured to control the operational voltage to be fed to at least one amplifier on the basis of at least one of the following:
- a signal to be amplified with the amplifier,
- an amplified signal modified in a desired manner,
- a predetermined signal, and
- a predetermined signal modified in a desired manner.

12. A power source for an amplifier, the power source being arranged to control electric operational power to be fed to the amplifier, the power source comprising:
- at least one voltage source unit and at least one current source unit, of which said at least one voltage source unit is configured to control the operational voltage to be fed to the amplifier;
- wherein the at least one current source unit is configured to feed operational electric current for the amplifier; and
- wherein an output node of the voltage source unit is connected to a first node of the current source unit, and a lower voltage pole of the voltage source unit is connected to a second node of the current source unit via a circuit which comprises at least one of a conductor, an adapting element, a controlled power source, and a direct current power source.

13. A power source for an amplifier, the power source being arranged to control electric operational power to be fed to the amplifier, the power source comprising:
- at least one voltage source unit that is configured to control the operational voltage to be fed to the amplifier;
- at least one current source unit that is configured to feed operational electric current to the amplifier; and
- at least one electric recycle circuit capable of recycling at least part of the output current of the current source unit that exceeds the operational power need of the amplifier including the current from the capacitive load associated with the amplifier.

14. A power source for an amplifier, the power source being arranged to control electric operational power to be fed to the amplifier, the power source comprising:
- at least one voltage source unit that is configured to control the operational voltage to be fed to the amplifier;
- at least one current source unit that is configured to feed operational electric current to the amplifier; and
- at least one electric recycle circuit capable of receiving at least part of the electric power that exceeds the operational power need of the amplifier including power from the capacitance associated with the amplifier and/or power directly or indirectly from the output of the current source unit when the current source is outputting power.

15. A power source for an amplifier, the power source being arranged to control electric operational power to be fed to the amplifier, the power source comprising:
- at least one voltage source unit that is configured to control the operational voltage to be fed to the amplifier;
- at least one current source unit that is configured to feed operational electric current to the amplifier; and
- at least one electric recycle circuit capable of recycling at least part of the electric power that exceeds the operational power need of the amplifier including power associated with a decrease of the operational voltage and/or power of the current source unit directly or indirectly.

16. A power source for an amplifier, the power source being arranged to control electric operational power to be fed to the amplifier, the power source comprising:
- at least one voltage source unit that is configured to control the operational voltage to be fed to the amplifier; and
- at least one electric recycle circuit capable of receiving at least part of the electric power that exceeds the operational power need of the amplifier, and transferring the at least part of the electric power to a current source and/or some other circuit outside the power source.

* * * * *